United States Patent
Brooks

(10) Patent No.: US 8,923,073 B2
(45) Date of Patent: Dec. 30, 2014

(54) STORAGE ELEMENT READING USING RING OSCILLATOR

(75) Inventor: Robert J Brooks, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/823,826

(22) PCT Filed: Nov. 1, 2010

(86) PCT No.: PCT/US2010/054922
§ 371 (c)(1),
(2), (4) Date: Mar. 15, 2013

(87) PCT Pub. No.: WO2012/060807
PCT Pub. Date: May 10, 2012

(65) Prior Publication Data
US 2013/0176767 A1  Jul. 11, 2013

(51) Int. Cl.
| | | |
|---|---|---|
| G11C 11/00 | (2006.01) | |
| G11C 7/06 | (2006.01) | |
| G11C 7/22 | (2006.01) | |
| G11C 13/00 | (2006.01) | |
| G11C 7/10 | (2006.01) | |
| G11C 7/00 | (2006.01) | |

(52) U.S. Cl.
CPC .......... G11C 13/0069 (2013.01); G11C 7/1015 (2013.01); G11C 7/00 (2013.01)
USPC ................ 365/189.011; 365/148; 365/189.07

(58) Field of Classification Search
USPC ................................... 365/189.011
See application file for complete search history.

(56) References Cited

U.S. PATENT DOCUMENTS

| | | | |
|---|---|---|---|
| 4,831,592 A * | 5/1989 | Nakai et al. | 365/189.09 |
| 5,144,525 A * | 9/1992 | Saxe et al. | 365/45 |
| 5,363,333 A | 11/1994 | Tsujimoto | |
| 7,620,510 B2 | 11/2009 | Carpenter et al. | |
| 7,782,107 B2 | 8/2010 | Dixit | |
| 2007/0001682 A1 | 1/2007 | Habitz | |
| 2007/0086232 A1 | 4/2007 | Joshi et al. | |
| 2007/0237012 A1 | 10/2007 | Kuang et al. | |

(Continued)

FOREIGN PATENT DOCUMENTS

| | | |
|---|---|---|
| JP | 2003-257173 | 9/2003 |
| JP | 2012-518862 | 8/2012 |

(Continued)

OTHER PUBLICATIONS

Cranksnaw, et al. An RSFQ Variable Duty Cycle Oscillator for Driving a Superconductive Qubit. IEEE Transactions on Applied Superconductivity. vol. 13, No. 2. Jun. 2003.

(Continued)

*Primary Examiner* — Son Mai
(74) *Attorney, Agent, or Firm* — Hewlett-Packard Patent Department

(57) ABSTRACT

Methods and apparatus are provided for use with data storage elements. A ring oscillator is coupled to a selected element within an array such that a feedback loop is defined. A period at oscillation for the ring oscillator is compared to a reference value. A data value stored within the selected element is determined accordingly. Stored data values remain essentially unaltered when accessed and read by way of the ring oscillator. Memory arrays having memristor or other storage elements can be used according to the present teachings.

15 Claims, 5 Drawing Sheets

(56) References Cited

U.S. PATENT DOCUMENTS

| | | |
|---|---|---|
| 2008/0043521 A1 | 2/2008 | Liaw et al. |
| 2008/0253200 A1 | 10/2008 | Wuidart |
| 2008/0273403 A1* | 11/2008 | Ehrenreich et al. ........... 365/194 |
| 2009/0027065 A1* | 1/2009 | Kuang et al. ................. 324/617 |
| 2009/0219756 A1 | 9/2009 | Schroegmeier et al. |
| 2009/0237984 A1 | 9/2009 | Porter |
| 2009/0327620 A1* | 12/2009 | Arsovski et al. .............. 711/154 |
| 2010/0110751 A1 | 5/2010 | Miyajima et al. |

FOREIGN PATENT DOCUMENTS

| | | |
|---|---|---|
| KR | 100631935 | 10/2006 |
| KR | 100942973 | 2/2010 |
| WO | WO-2010/097302 | 9/2010 |

OTHER PUBLICATIONS

JPO; Japanese Office Action cited in JP application No. 2013-534887; dated Dec. 17, 2013; 4 pages.

Korean Intellectual Property Office, International Search Report and Written Opinion for International Appl. No. PCT/US2010/054922 dated Jul. 1, 2011 (8 pages).

The International Bureau of WIPO, International Preliminary Report on Patentability for International Appl. No. PCT/US2010/054922 dated May 16, 2013 (6 pages).

\* cited by examiner

STORAGE ELEMENT READING USING RING OSCILLATOR

CROSS-REFERENCE TO RELATED APPLICATION

This application is a national stage application under 35 U.S.C. §371 of PCT/US2010/054922, filed Nov. 1, 2010.

BACKGROUND

Various types of electronic memory for are known. Typically, data values are stored therein and retrieved there from using electrical signaling. Storage elements or "cells" within such memories can be individually addressed so that these respective writing and reading operations can foe performed.

However, some recently developed types of storage elements ere such that data values stored therein can be undesirably altered or otherwise adversely affected by known signaling techniques. The present teachings address the foregoing and other concerns.

BRIEF DESCRIPTION OF THE DRAWINGS

The present embodiments will now be described, by way of example, with reference to the accompanying drawings, in which.

DETAILED DESCRIPTION

Introduction

Figure 1:
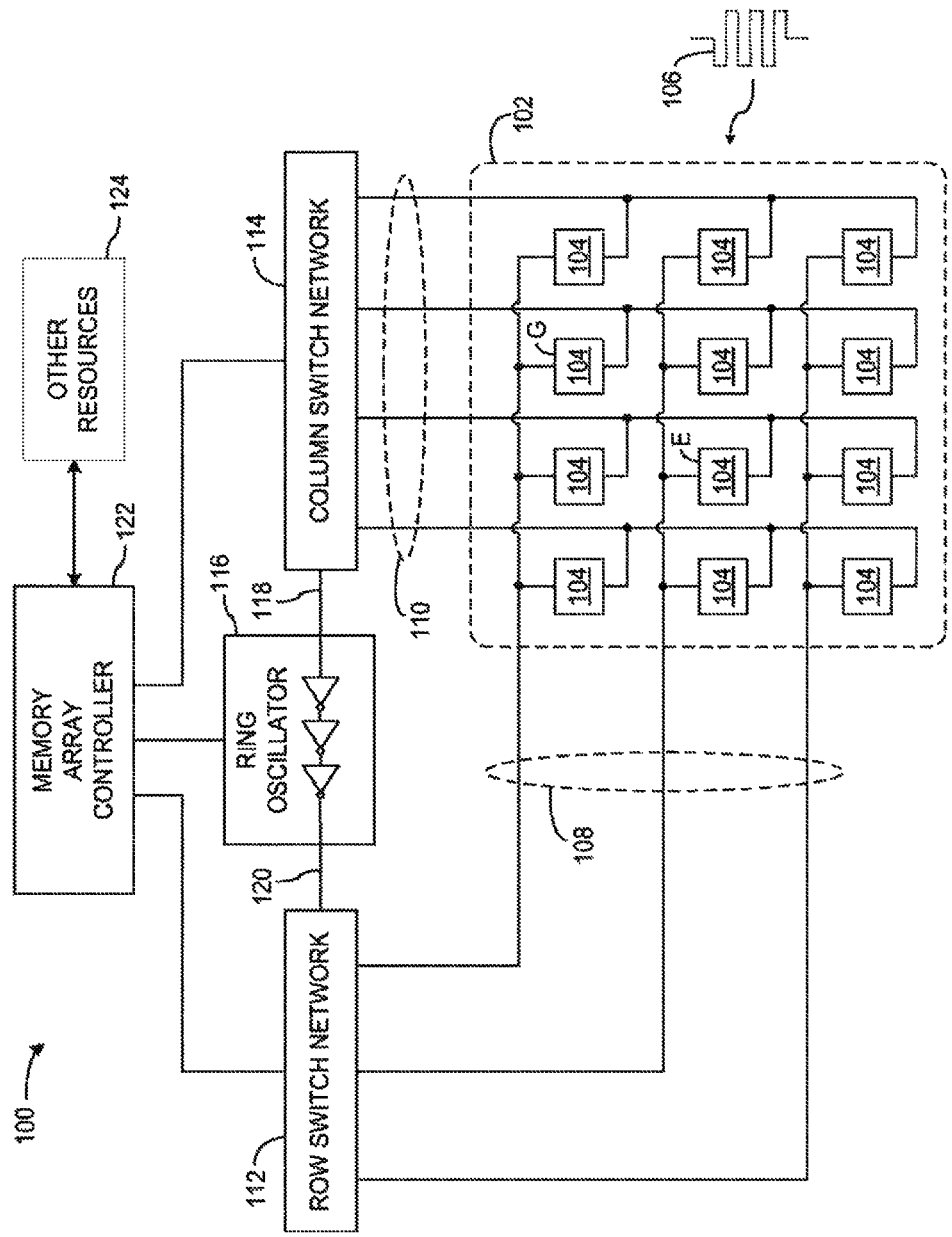
FIG. 1 is block diagram of a data storage apparatus according to one example.

Methods and apparatus are provided for use with data storage elements. A ring oscillator is coupled to a selected storage element within an array such that a feedback loop is defined. A period of oscillation for the ring oscillator is measured and compared to a reference value. A data value stored within the selected element is determined according to the comparison. Stored data values remain essentially unaltered when accessed and read by way of the ring oscillator. Memory arrays having memristor or other storage elements can be used according to the present teachings.

In one embodiment an apparatus includes a plurality of storage elements individually addressable by way of respective row address lines and column address lines. The apparatus also includes a ring oscillator configured to be selectively coupled to the storage elements by way of the row address lines and the column address lines so as to establish a feedback pathway. The ring oscillator is characterized by an oscillation period correspondent to a data value stored within one of the storage elements that is coupled thereto.

In another embodiment, a system for storing date values includes an array of plural storage elements. The system also includes a ring oscillator characterized by an input node and an output node. The ring oscillator operates with a characteristic period in accordance with a data value stored within a one of the storage elements that is coupled to the ring oscillator by way of the input and output nodes. The system further includes control circuitry configured to compare the characteristic period with a previously determined reference value for the array of plural storage elements. The control circuitry is further configured to provide a digital signal indicative or the data value in accordance with the comparison.

In still another embodiment a method includes programming all storage elements of a memory array to a first value. The method also includes programming a selected storage element of the memory array to a second value different than the first value. The method further includes measuring a first period of oscillation "P1" for a ring oscillator coupled to the selected storage element. Additionally, the meshed includes programming all the storage elements to the second value and programming the selected storage element to the first value. The method also includes measuring a second period of oscillation "P2" for the ring oscillator coupled to the selected storage element. The method further includes calculating a reference value "V" for the array using the first period of oscillation P1 and the second period of oscillation P2.

In another embodiment, a method of accessing a data storage array includes coupling a ring oscillator to a selected storage element of the data storage array by way of an input node and an output node of the ring oscillator such that a feedback loop is defined. The method also includes measuring a period of oscillation for the ring oscillator. The method further includes comparing the measured period of oscillation to a previously determined reference value for the data storage array. The method additionally includes determining a data value stored within the selected storage element in accordance with the comparison.

First Illustrative Apparatus

Reference is now directed to FIG. 1, which depicts a block diagram of an apparatus 100. The apparatus 100 is illustrative and non-limiting with respect to the present teachings. Thus, other apparatuses, devices or systems can be configured and/or operated in accordance with the present teachings.

The apparatus 100 includes a memory array (array) 102 of data storage elements 104. Each of the data storage elements 104—also referred to as storage elements 104 herein—is configured to store at least two distinct data values by way of corresponding values of at least one electrical characteristic. Such electrical characteristics include resistance, capacitance, inductance, or a combination of two or more of these. In one example, each storage element 104 can store one bit of binary (i.e., base-two) data—value "zero" or "one"—by way of a non-volatile adjustment in electrical resistance, in one example, some or all of the storage elements 104 are defined by a memory resistor or "memristor" 106. Other storage element types and/or data storage schemes (base-three, base-eight, base-sixteen and so on) can also be used.

The array 102 is depicted as a four-by-three arrangement, including a total of twelve storage elements 104, in the interest of clarity. However, it is to be understood that arrays of any practical size and configuration are contemplated by the present teachings, up to and greater than one-thousand by one-thousand (1K by 1K). Each of the storage elements 104 is individually addressable by way of corresponding row address lines 108 and column address lines 110. Any particular storage element 104 can be accessed and data values can be written to and read from by way of a particular row address line 108 and a particular column address line 110.

The apparatus 100 also includes a row switch network 112 configured to couple various aspects of the apparatus 100 or other entitles to selected ones of the storage elements 104 by way of the row address lines 108. The row switch network 112 can include, for non-limiting example, field-effect transistors (FETs), pass FETs, pass gates, diodes, bipolar transistors, electromechanical switches, or other devices or entities. One having ordinary skill in the electrical and related arts can appreciate that various suitable switches and elements can be used to define the row switch network 112 and further elaboration is not needed for purposes of understanding the present teachings.

The apparatus 100 also includes a column switch network 114 configured to couple aspects of the apparatus 100 or other entities to selected ones of the storage elements 104 by way of the column address lines 110. The column switch network 114 can include, for example, field-effect transistors (FETs), pass FETs, pass gates, diodes, bipolar transistors, electromechanical switches, etc. One having ordinary skill in the electrical and related arts can appreciate that the column switch network 114 can be various defined and further elaboration is not needed for purposes of understanding the present teachings.

The apparatus 100 farther includes a ring oscillator 116. The ring oscillator 116 can be defined by or include an odd-number of logical inverter gates coupled in series-circuit arrangement. The ring oscillator 116 is further defined by an input node 118 and an output node 120. The ring oscillator 116 is configured to be coupled to selected ones of the storage elements 104 by way of the row switch network 112 and the column switch network 114. A selected storage element 104 defines part of a feedback pathway or loop when coupled to the ring oscillator 116 by way of the input node 118, the output node 120, the row switch network 112 and the column switch network 114.

In particular, a selected storage element 104 is a series-circuit element in a feedback loop with respect to the ring oscillator 116. No feedback loop exists until a selected storage element 104 is coupled to the ring oscillator 116 by way of the row switch network 112 and the column switch network 114. The electrical characteristics of such a feedback pathway affect the operating frequency and corresponding period of the ring oscillator 116, as will be further described below.

The apparatus 100 also includes a memory array controller (controller) 122. The controller 122 can be variously defined and can include a microcontroller, a microprocessor, a state machine, an application-specific integrated circuit (ASIC), or other suitable constituency. The controller 122 is configured to control various normal operations of the apparatus 100.

Non-limiting examples of operations of the controller 122 include: storing data values within the array 102, reading data values from the array 102, monitoring or enabling operation of the ring oscillator 116, controlling operations of the row switch network 112 and the column switch network 114, receiving data values from and providing data values to other resource 124 of the apparatus 100, and so on. Other normal operations can also be controlled by the controller 122.

In particular, the controller 122 is configured to store (write or program) date values to the storage elements 104 by way of appropriate electrical signaling. In one example, such data writing signals are defined by direct-currant (DC) pulses formatted to increase or decrease the non-volatile electrical resistance of the selected storage element 104. The controller 122 is also configured to retrieve (read) data values stored in the storage elements 104 by way of the ring oscillator 116. Further discussion regarding operations of the array 102 by way of the ring oscillator 118 is provided below.

First Illustrative System

Figure 2:
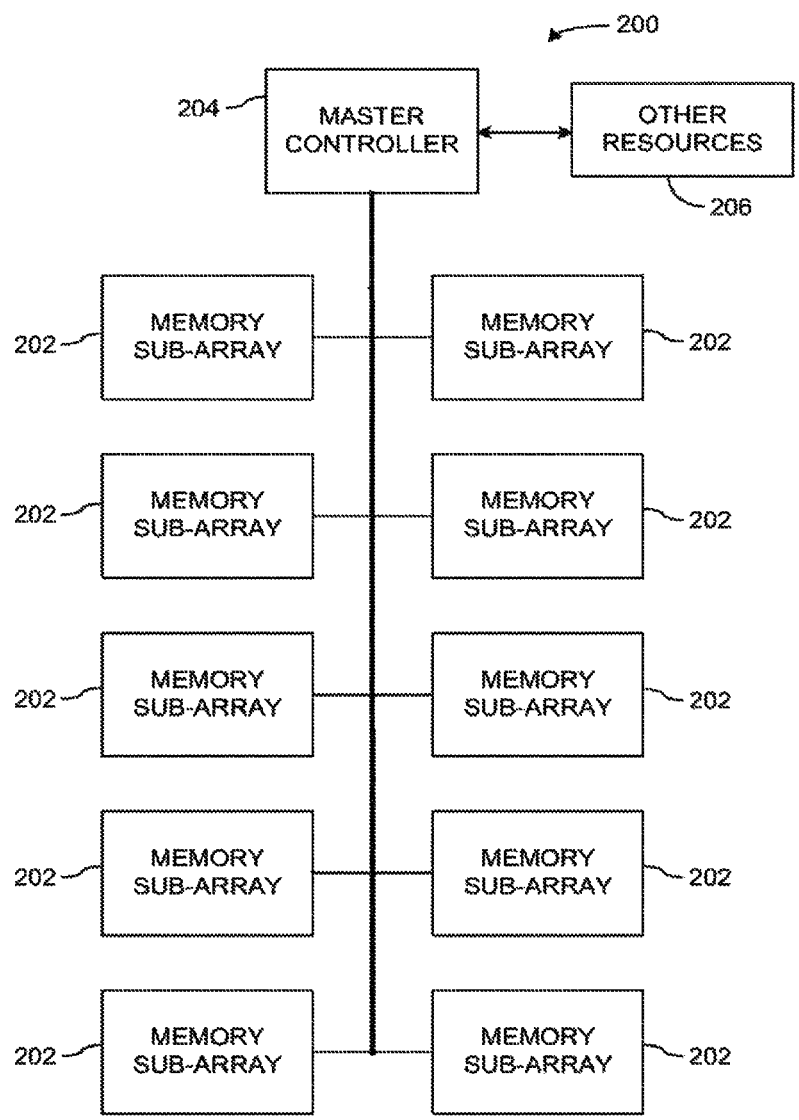
FIG. 2 is a block diagram of & data storage system according to another example.

Attention is given to FIG. 2, which depicts a block diagram of a data storage system 200. The system 200 is illustrative and non-limiting with respect to the present teachings. Thus, ether apparatuses, devices or systems can be configured and/or operated in accordance with the present teachings.

The system 200 includes a plurality of memory sub-arrays 202. Each sub-array 202 can be defined, for example, by the apparatus 100. Other sub-array architectures can also be used. Specifically, each sub-array 202 includes plural storage elements (e.g., 104) that are readable by way of a ring oscillator (e.g., 116). Each sub-array 202 is therefore configured for the storage and retrieval of data values.

The system 200 also includes a master controller 204. The master controller 204 is configured to control storage and retrieval of data using the sub-arrays 202. The master controller 204 as configured to selectively address particular memory sub-arrays 202 and to bidirectionally communicate data values between the sub-arrays 202 and other resources 208. Non-limiting examples of other resources 206 include entities external to the system 200, a microprocessor, communication circuitry coupled to a network or the Internet, other data storage systems, and so on.

The data storage system 200 includes a total of ten memory sub-arrays 202 in the interest of clarity. However, the present teachings anticipate various data storage systems having any practical number of sub-arrays, each having discretely addressable storage elements that are read by way of a ring oscillator.

First Illustrative Method

Figure 3A:
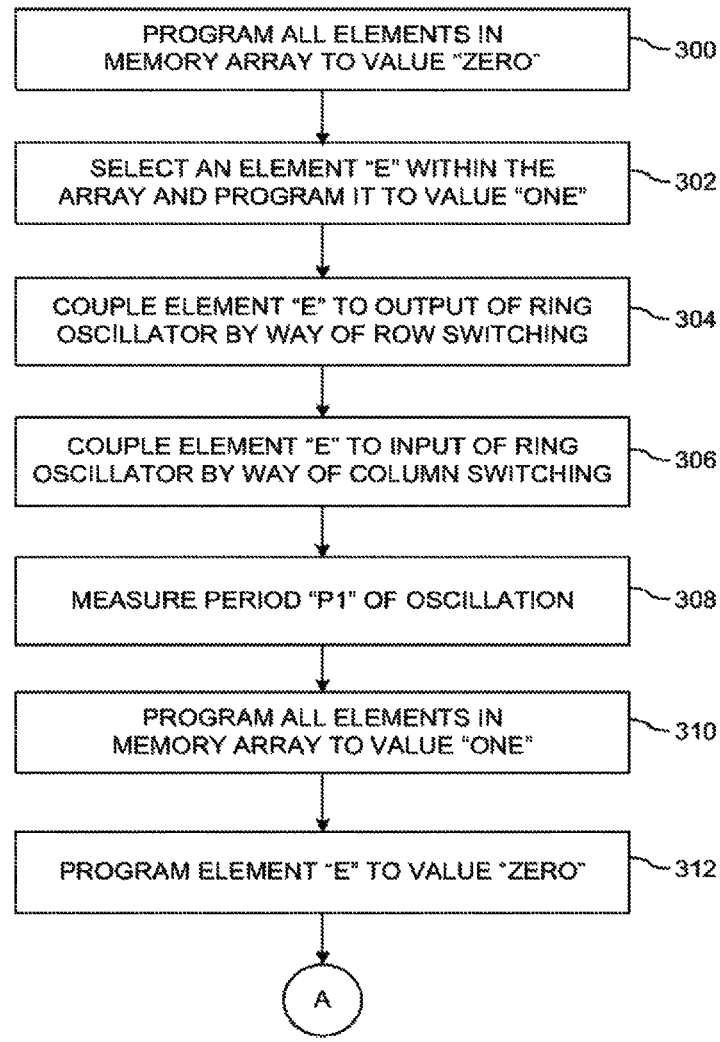
FIG. 3A is a flow diagram depicting a portion of a method according to one example.

Attention is now directed to FIG. 3A, which depicts a flow diagram of a portion of a method according to an example of the present teachings. The method of FIG. 3A includes particular operations and order of execution. However, other methods including other operations, omitting one or more of the depicted operations, and/or proceeding in other orders of execution can also be used according to the present teachings. Thus, the method of FIG. 3A is illustrative and non-limiting in nature. Reference is also made to FIG. 1 in the interest of understanding the method of FIG. 3A.

At 300, all elements in a memory array are programmed to a value of "zero". For purposes of illustration, all of the storage elements 104 in the array 102 are programmed (i.e., written to) so as to store a first data value "zero". This programming is performed by way of electrical signals issued by the memory array controller 122. In one example, each storage element 104 is addressed in a sequential order until all storage elements 104 have been programmed. In another example, two or more or all of the storage elements 104 are programmed simultaneously.

At 302, an element "E" within the memory array is selected and programmed to a value of "one". In the present illustration, a storage element 104 that is also designated "E" is discretely addressed by way of the corresponding row address line 108 and the corresponding column address line 110. The controller 122 then issues appropriate electrical signaling to write a second data value of "one" to the particular storage element "E". The particular storage element "E" is arbitrary and for purposes of illustration. Numerous selection schemes can be used that are not germane to the present teachings.

At 304, the selected element "E" is coupled to an output node of the ring oscillator of the memory array. For purposes of the present illustration, the row switch network 112 is signaled try the controller 122 such that the storage element "E" is coupled to the output node 120 of the ring oscillator 116.

At 306, the selected element "E" is coupled to an input node of the ring oscillator of the memory array. For purposes of the present illustration, the column switch network 114 is signaled by the controller 122 such that the storage element "E" is coupled to the input node 118 of the ring oscillator 116.

The storage element "E" is now pad of a feedback loop coupled to the ring oscillator 116.

At 308, a period of oscillation "P1" is measured for the ring oscillator. In the present illustration, the controller 122 senses and measures a period of oscillation (i.e., reciprocal of frequency) "P1" for the ring oscillator 116. The controller 122 then stores the value "P1" internally as a register value, within cache memory, or other storage. The particular form of storage internal to the controller 122 is not germane to the present teachings. The ring oscillator 116 is then de-coupled from the storage element "E" once the value "P1" has been measured and stored.

At 310, all elements in the memory array are programmed to a value of "one". For purposes of the present illustration, all of the storage elements 104 in the array 102 are programmed to the second data value "one". This programming is performed by way of electrical signals issued by the memory array controller 122. In one example, each storage element 104 is addressed in a sequential order until all storage elements 104 have been programmed. In another example, two or more or all of the storage elements 104 are programmed simultaneously.

Figure 3B:
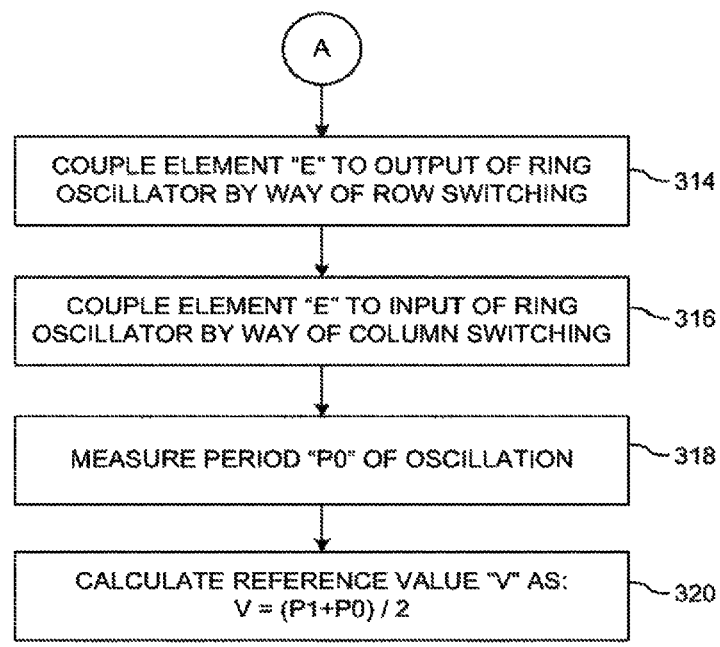
FIG. 3B is a flow diagram depicting another portion of the method of FIG. 3A.

At 312, the element "E" within the memory array is selected and programmed to a value of "zero". In the present illustration, the storage element "E" is discretely addressed and the controller 122 then writes the first data value "zero" to the storage element "E". Attention is now directed to FIG. 3B, which depicts a flow diagram having another portion of the method of FIG. 3A.

At 314, the selected element "E" is coupled to an output node of the ring oscillator of the memory array. For purposes of the present illustration, the row switch network 112 is signaled by the controller 122 such that the storage element "E" is coupled to the output node 120 of the ring oscillator 110.

At 318, the selected element "E" is coupled to an input node of the ring oscillator of the memory array. Under the present illustration, the column switch network 114 is signaled by the controller 122 such that the storage element "E" is coupled to the input node 118 of the ring oscillator 116.

At 318, a period of oscillation "P0" is measured for the ring oscillator. In the present illustration, the controller 122 senses and measures a period of oscillation "P0" for the ring oscillator 118. The controller 122 then stores the value "P0" internally as a register value, within cache memory, or similarly. The ring oscillator 116 is then de-coupled from the storage element "E" once the value "P1" has been measured and stored.

At 320, a reference value "V" is calculated for the memory array using the period of oscillation values "P1" and "P0". Under the present illustration, the controller 122 calculates a reference value "V" according to the formula: V=(P1+P0)/2. Thus, the average of the respective periods of oscillation "P1" and "P0" is determined. The resulting value "V" is then stored internally within the controller 122 for other use as described hereinafter.

Second Illustrative Method

Figure 4:
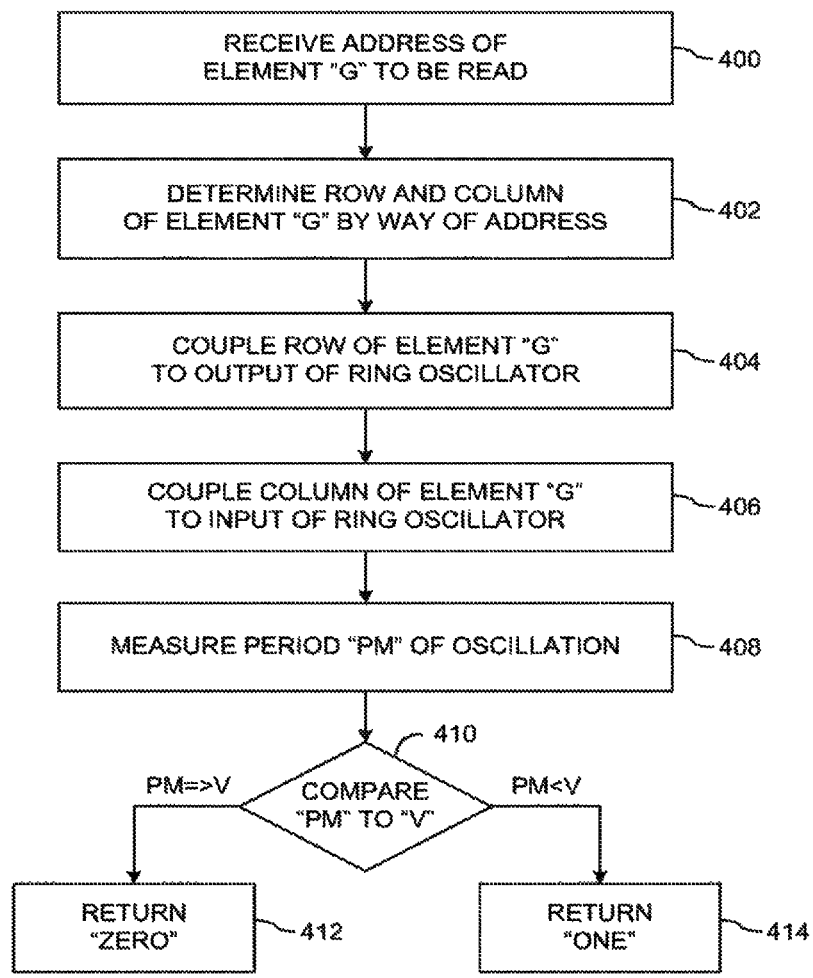
FIG. 4 is a flow diagram depleting a method according to another example.

Attention is now directed to FIG. 4, which depicts a flow diagram of a method according to another embodiment according to the present teachings. The method of FIG. 4 includes particular operations and order of execution. However, other methods including oilier operations, omitting one or more of the depicted operations, and/or proceeding in other orders of execution can also be used according to the present teachings. Thus, the method of FIG. 4 is illustrative and non-limiting in nature. Reference is also made to FIG. 1 in the interest of understanding the method of FIG. 4.

At 400, a controller of a memory array receives an address of a storage element to be read. For purpose of illustration, the memory array controller 122 receives a request from other resources 124 to read a data value stored in a storage element 104 that is also designated "G". The received request includes an address or other appropriate identifier for the particular storage element "G". For further purposes of this illustration, the array 102 is configured to stem binary (i.e., base-two) data values. However, the present teachings contemplate storage arrays configured to store other systems of data values (e.g., base-three, base-eight, and so on).

At 402, the controller determines a row and column of the storage element "G" from the received address. Under the present illustration, the controller 122 uses the address (or other identifier information) received at 400 to determine a row and column "intersection" for the particular storage element "G".

At 404, the row of the storage element "G" is coupled to the output of a ring oscillator of the array. Under the present illustration, the controller 122 signals the row switch network 112 to couple the storage element "G" to the output node 120 of the ring oscillator 116.

At 406, the column of the storage element "G" is coupled to the input of the ring oscillator. Under the present illustration, the controller 122 signals the column switch network 114 to couple the storage element "G" to the input node 118 of the ring oscillator 116.

At 408, a period of oscillation "PM" is measured for the ring oscillator. In the present illustration, the controller 122 measures a period of oscillation (i.e., reciprocal of frequency) "PM" for the ring oscillator 116. The controller 122 then stores the value "PM" internally. The ring oscillator 116 is then de-coupled from the storage element "G" once the value "PM" has been measured and stored.

At 410, the measured value "PM" is compared to a previously measured reference value "V" for the array. For purposes of the present illustration, the controller 122 retrieves a previously determined reference value "V" for the array 102 from internal storage. The controller 122 then compares the value "V" to the value "PM" just measured. If the value "PM" is greater than or equal to the value "V" then the method proceeds to step 412 below. If the value "PM" is lesser than the value "V" then the method proceeds to step 414 below.

At 412, the controller returns a value of "zero". For purposes of present illustration, the controller 122 returns a value of "zero", or another first value, to the other resources 124. The method of FIG. 4 is now complete for one operational instance.

At 414, the controller returns a value of "one". For purposes of present illustration, the controller 122 returns a value of "one", or another second value, to the other resources 124. The method of FIG. 4 is now complete for one operational instance.

The foregoing methods and apparatus are illustrative of any number of embodiments contemplated by the present teachings. In general, and without limitation, data storage arrays, apparatus and systems are contemplated. Such an array includes a plurality of discretely addressable storage elements each configured to store a data value (binary, trinary, octal, and so on) by way of a programmable, non-volatile electrical characteristic. Such electrical characteristics include resistance, capacitance, inductance or a combination of two or more such characteristics. In one or more examples, the storage elements are defined by memristors. Other storage elements can be used.

A ring oscillator is selectively coupled to storage elements of the array such that a feedback loop is defined and the ring oscillator oscillates accordingly. The period of oscillation corresponds to the present electrical characteristic(s) of the selected storage element and thus the data value stored therein. The period of oscillation is then measured by a controller or other suitable resource and compared to a reference value for the array. The comparison is used to determine a specific data value, within a tolerance, stored within the respective storage element. That data value is then communicated to other resources, used in internal calculations or operations, and so on.

The resistive-capacitive (RC) time constant of the selected storage element is significantly lesser than the parasitic time constant of the remainder of the data storage array. In turn, the period of oscillation of the ring oscillator is most affected by the present state of the selected storage element, while parasitic characteristics have a negligible affect. Reliable data reading operations are thus performed according to the present teachings.

The present teachings are also distinct from known techniques that use purely Ohmic (i.e., voltage versus current) measurements. Specifically, the electrical resistance of a selected storage element is difficult to discern from the aggregate resistance of an array of such elements under known techniques. This problem is substantially avoided by way of the ring oscillator operations of the present teachings.

Stored data values read by way of a ring oscillator remain essentially unchanged due to the nature of the oscillating electrical signal. This is particularly useful in en embodiment having memristors programmed via direct-current signals, but wherein the non-volatile electrical resistance remains essentially unaltered when subjected to a low-level, alternating-current signal.

In general the foregoing description is intended to be illustrative and not restrictive. Many embodiments and applications ether than the examples provided would be apparent to those of ordinary skill in the art upon reading the above description. The scope of the invention should be determined, not with reference to the above description, but should instead be determined with reference to the appended claims, along with the full scope of equivalents to which such claims are entitled, it is anticipated and intended that future developments will occur in the arts discussed herein, and that the disclosed systems and methods will be incorporated into such future embodiments. In sum it should be understood that the invention is capable of modification and variation and is limited only by the following claims.

What is claimed is:

1. An apparatus, comprising:
    a plurality of storage elements individually addressable by way of respective row address lines and column address lines;
    a ring oscillator configured to be selectively coupled to the storage elements by way of the row address lines and the column address lines so as to establish a feedback pathway, the ring oscillator characterized by an oscillation period correspondent to a data value stored within one of the storage elements coupled to the ring oscillator; and
    control circuitry configured to provide a digital signal in accordance with the oscillation period, and in accordance with a previously determined reference value for the plurality of storage elements.

2. The apparatus according to claim 1, the control circuitry further configured to store respective data values within the storage elements.

3. An apparatus, comprising:
    a plurality of storage elements individually addressable by way of respective row address lines and column address lines; and
    a ring oscillator configured to be selectively coupled to the storage elements by way of the row address lines and the column address lines so as to establish a feedback pathway, the ring oscillator characterized by an oscillation period correspondent to a data value stored within one of the storage elements coupled to the ring oscillator,
    one or more of the storage elements defined by respective one or more memristors.

4. The apparatus according to claim 1, the data value stored within the storage element coupled to the ring oscillator remaining unchanged during the coupling to the ring oscillator.

5. The apparatus according to claim 1 further comprising:
    a row switching network configured to couple either an output node or an input node of the ring oscillator to selected ones of the storage elements by way of the row address lines; and
    a column switching network configured to couple the other of the output node or the input node of the ring oscillator to selected ones of the storage elements by way of the column address lines.

6. The apparatus according to claim 1, comprising a data storage array configured to store data values according to a base-two or higher data schema.

7. A system for storing data values, comprising:
    an array of plural storage elements;
    a ring oscillator including an input node and an output node, the ring oscillator to operate with a characteristic period in accordance with a data value stored within a selected one of the storage elements coupled to the ring oscillator by way of the input and output nodes; and
    control circuitry configured to compare the characteristic period with a previously determined reference value for the array of plural storage elements, the control circuitry further configured to provide a digital signal indicative of the data value in accordance with the comparison.

8. The system according to claim 7, the selected one of the storage elements being part of a series-circuit feedback loop of the ring oscillator.

9. A method, comprising:
    programming storage elements of a memory array to a first value;
    programming a selected storage element of the memory array to a second value different than the first value;
    measuring a first period of oscillation for a ring oscillator coupled to the selected storage element;
    programming the storage elements to the second value;
    programming the selected storage element to the first value;
    measuring a second period of oscillation for the ring oscillator coupled to the selected storage element; and
    calculating a reference value for the memory array using the first period of oscillation and the second period of oscillation.

10. The method according to claim 9 further comprising coupling the ring oscillator to the selected storage element such that a feedback loop is defined.

11. The method according to claim 9, the calculating the reference value being performed in accordance with computing an average of the first period of oscillation and the second period of oscillation.

12. The method according to claim 9 further comprising using the reference value while determining a data value stored in one of the storage elements of the array.

13. The method according to claim 9, at least one of the storage elements of the memory array being a memristor.

14. A method of accessing a data storage array, comprising:
coupling a ring oscillator to a selected storage element of the data storage array by way of an input node and an output node of the ring oscillator such that a feedback loop is defined;
measuring a period of oscillation for the ring oscillator;
comparing the measured period of oscillation to a previously determined reference value for the data storage array; and
determining a data value stored within the selected storage element in accordance with the comparison.

15. The method according to claim 14, there being no feedback loop when the ring oscillator is not coupled to a storage element of the data storage array.

\* \* \* \* \*